United States Patent [19]

Tanaka

[11] Patent Number: 4,710,797
[45] Date of Patent: Dec. 1, 1987

[54] ERASABLE AND PROGRAMABLE READ ONLY MEMORY DEVICES

[75] Inventor: Seietsu Tanaka, Tokyo, Japan

[73] Assignee: Oki Electric Industry Co., Ltd., Tokyo, Japan

[21] Appl. No.: 586,998

[22] Filed: Mar. 7, 1984

[30] Foreign Application Priority Data

Mar. 14, 1983 [JP] Japan .................. 58-40579

[51] Int. Cl.⁴ .................. H01L 23/08; H01L 23/18
[52] U.S. Cl. .................. 357/74; 357/80; 174/52 PE; 361/401
[58] Field of Search .................. 357/74, 75, 80; 361/401; 174/52 FP, 52 PE

[56] References Cited

U.S. PATENT DOCUMENTS

| | | | |
|---|---|---|---|
| 3,622,419 | 11/1971 | London et al. | 361/401 |
| 3,924,246 | 12/1975 | Scherer | 357/74 |
| 4,114,177 | 9/1978 | King | 357/75 |

FOREIGN PATENT DOCUMENTS

| | | | |
|---|---|---|---|
| 2513536 | 11/1975 | Fed. Rep. of Germany | 361/401 |
| 0143839 | 9/1980 | Fed. Rep. of Germany | 357/74 B |
| 0052590 | 4/1977 | Japan | 357/74 B |
| 0062776 | 5/1980 | Japan | 357/74 C |
| 0093346 | 7/1981 | Japan | 357/74 |
| 0085554 | 5/1983 | Japan | 357/74 |

Primary Examiner—James W. Davie
Assistant Examiner—Vangelis Economou
Attorney, Agent, or Firm—Wenderoth, Lind & Ponack

[57] ABSTRACT

An EPROM device is constituted by an IC lead frame having an island area and a plurality of lead wires, an EPROM IC chip mounted in the island area of the frame, a plurality of wirings, each connecting the bonding pad of the IC chip to one of the lead wires, a layer of silicone resin material formed on the upper surface of the IC chip, a window plate placed on the surface of the silicone resin layer for transmitting ultraviolet rays and bonded to the silicone resin layer, and a molded package of epoxy resin encapsulating the chip island area, the EPROM chip and the silicone resin layer so as to expose the upper surface of the window plate.

2 Claims, 8 Drawing Figures

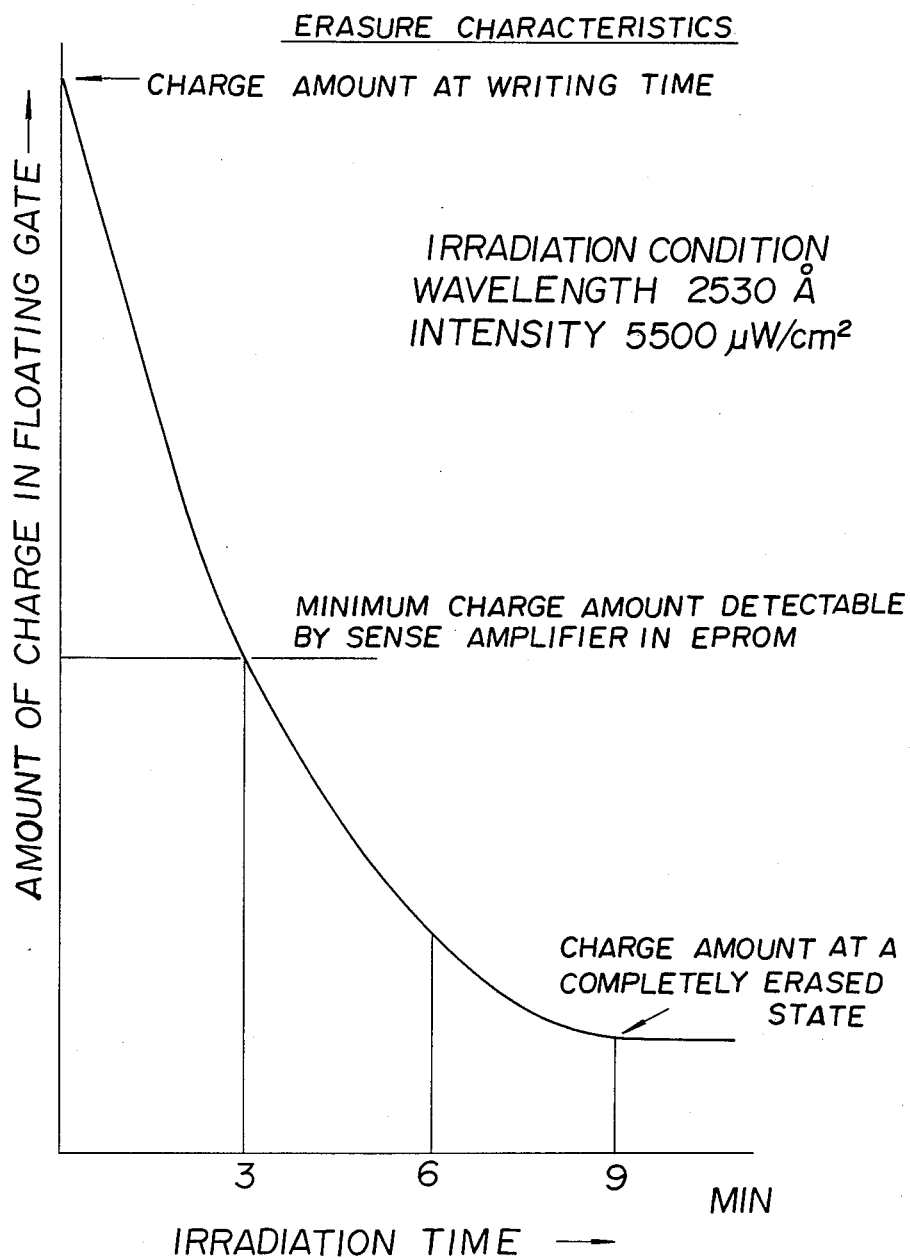

ERASABLE AND PROGRAMABLE READ ONLY MEMORY DEVICES

BACKGROUND OF THE INVENTION

1. Field of the Invention

This invention relates to an erasable and programable read only memory device, more particularly to an erasable and programable read only memory device (EPROM) contained in a package having a window for injecting light.

2. Description of the Prior Art

In recent years, an erasable and programable read only memory device (EPROM) of the type on which data electrically written and erased by ultraviolet rays is used in many applications, because the content of the memory device can be rewritten as desired by a user. Generally, the IC chip of the prior art EPROM device has been sealed in a dual line type ceramic package.

As shown in FIG. 1, the chip 4 is secured to a metallized surface of the cavity portion 3 of a ceramic substrate by an alloying method. A plurality of lead wires 1 are secured to the surface of the ceramic substrate 2 by using low-melting point glass and the lead wires are mutually connected by an aluminum wire 5 for the purpose of connecting the lead wires to the chip 4.

A ceramic cap 7 having a glass lens 6 for transmitting ultraviolet rays is mounted on the top of the ceramic substrate 2. While maintaining the lens 6 and the chip 4 in an aligned state, the ceramic substrate 2 and the ceramic cap 7 are secured together with the low melting point glass so as to perfectly seal the chip 4.

Such a prior art EPROM device, however, has various defects as follows.

More particularly, the ceramic package provided with a window requires a number of parts so that its manufacturing cost is high.

Furthermore, it has been essential to use low melting point glass for sealing the ceramic package. For providing a seal with low melting glass, the IC chip is heated at a temperature of about 480° C. for more than 5 minutes so that it has been impossible to use gold wires for interconnecting the bonding pads and lead wires made of aluminum of the chip, whereby high speed bonding is difficult, thus increasing the cost of manufacturing.

Moreover, as the specific gravity of the ceramic package and the low melting glass is high, where a large number of EPROM devices are mounted on a printed board of a computer, the weight thereof increases and its handling becomes inconvenient.

Due to these problems, it has been desired to provide a plastic molded EPROM device. However, it is very difficult to provide a light transmitting window for a molded IC package thus failing to realize an EPROM device having high reliability.

SUMMARY OF THE INVENTION

Accordingly, it is an object of this invention to provide a novel erasable and programable read only memory device of a molded plastic package construction having a light transmitting or light impinging window.

Another object of this invention is to provide a novel erasable and programable read only memory device capable of greatly decreasing the manufacturing cost.

According to this invention, there is provided an erasable and programable read only memory device (EPROM) of the plastic package type comprising an IC lead frame having an island area and a plurality of wirings each connecting a bonding pad of the IC chip to one of the lead wires of the frame, a layer of a silicone resin formed on the upper surface of the IC chip, a window plate placed on the surface of the silicone resin layer for transmitting ultraviolet rays and bonded to the silicone resin layer, and a molded package of epoxy resin encapsulating the chip island area, the EPROM chip and the silicone resin layer so as to expose the upper surface of the window plate.

BRIEF DESCRIPTION OF THE DRAWINGS

In the accompanying drawings:

FIG. 3 is a graph showing the ultraviolet ray erasing characteristics of the EPROM device according to this invention.

DETAILED DESCRIPTION OF THE PREFERRED EMBODIMENT

Figure 1:
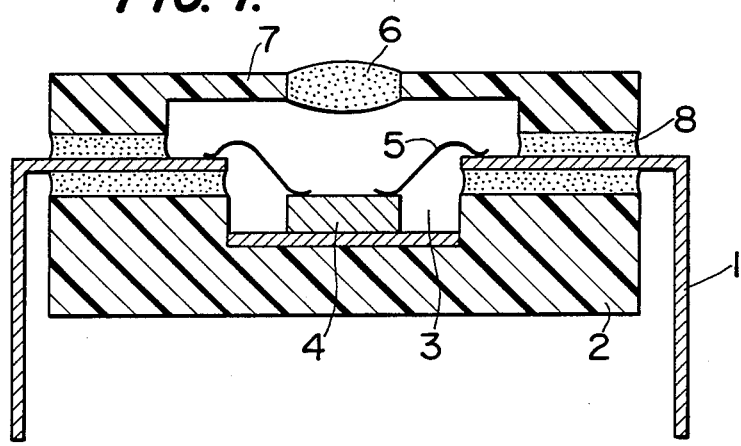
FIG. 1 is a sectional view showing the construction of a prior art EPROM device contained in a ceramic package.
Figure 2A:
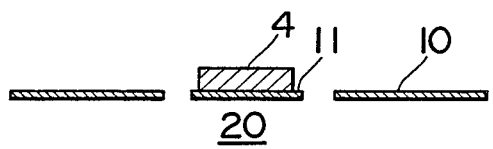
FIGS. 2(a) through (f) are sectional views showing successive steps of manufacturing an EPROM device embodying the invention and contained in a molded package.
Figure 2B:
Figure 2C:
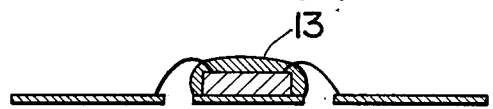
Figure 2D:
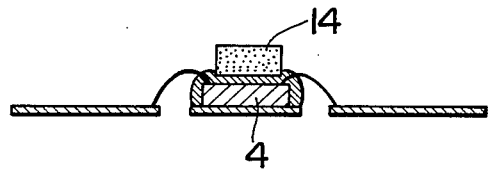
Figure 2E:
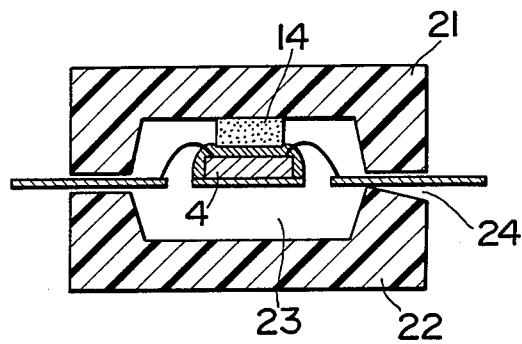
Figure 2F:
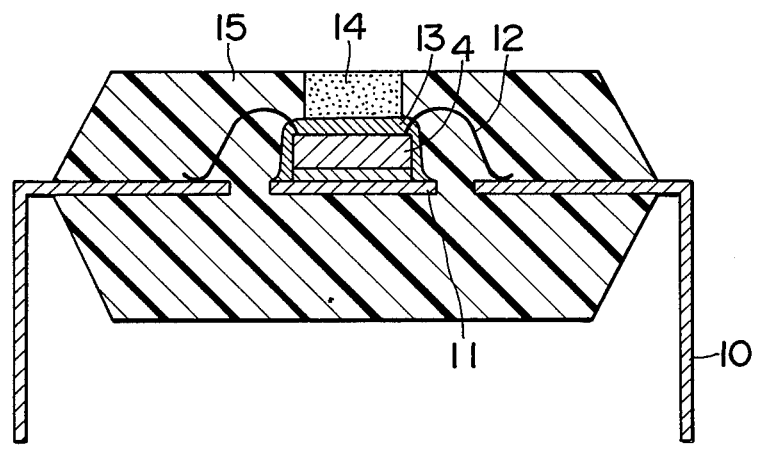

A preferred embodiment of this invention is shown in FIG. 2f. At first, successive steps of manufacturing the EPROM device shown in FIG. 2f will be described with reference to FIGS. 2a to 2e. A lead frame 20 shown in FIG. 2a comprises a plurality of lead wires 10 and an island portion or area 11 for supporting a chip 4 with a metallized surface. As shown in FIG. 2a, the chip 4 of the EPROM and the island portion 11 are fused together by alloying.

As shown in FIG. 2b, the lead wires 10 and the bonding pad, not shown, of the chip 4 are electrically interconnected by gold wires 12.

Then, as shown in FIG. 2c, a layer 13 made of a silicone resin and having a thickness of about 10–20 μm is applied onto the surface of the chip 4, which acts as a light receiving surface. As the silicone resin, JCR-6110 and JCR-6122 made by Toray Co., Ltd. are suitable.

On the surface of the silicone resin layer 13 is disposed a layer, for example, a high purity alumina plate having a thickness of about 1.5 mm and a thermal expansion coefficient of about 7 to $9 \times 10^{-6}$/°C. When the assembly is heated at 180° C. for about two hours, the silicone resin layer 13 sets to securely hold the light transmitting plate 14.

The light transmitting plate 14 can transmit ultraviolet rays of from 2,000 to 3,000 Å and it is advantageous to have a thermal expansion coefficient close to that of the silicone resin. Other inorganic materials such as sapphire, and organic material such as polypropylene resin and polyester resin can also be used as the light transmitting plate.

The light transmitting plate 14 can also be made of a silicone resin plate JCR-6122 (manufactured by Toray Co., Ltd.). The silicone resin layer 13 not only transmits ultraviolet rays but also bonds together the chip 4 and the light transmitting plate 14. Moreover, the silicone resin layer 13 is effective to protect the surface of the chip 4 and to prevent invasion of moisture from outside.

Then, as shown in FIG. 2e, the chip 4, island portion 11 and the light transmitting plate 14 are disposed in a mold cavity 23 defined by mold frames 21 and 22, and a conventional molding resin liquid, for example, an epoxy resin liquid which does not transmit ultraviolet rays having a thermal expansion coefficient of about $20 \times 10^{-6}/°C$. is poured into the mold cavity 23 through a pouring port 24.

When heated to about 170° C., the molding resin liquid undergoes polymerization to form a molded package 15 as shown in FIG. 2f.

During the molding step, since the erasing characteristic of the EPROM device degrades, it is necessary to prevent the molding from covering the surface of the light transmitting plate 14.

FIG. 3 shows the ultraviolet ray erasing characteristic of the EPROM device of this invention in which JCR-6122 described above is used as a high purity alumina bonding agent for the light transmitting plate. When ultraviolet rays having a wavelength of 2530 Å (intensity of 5500 $\mu W/cm^2$ intensity) are irradiated for about 9 minutes, the electric charge accumulated at the floating gate of a FAMOS type transistor in the EPROM device disappears substantially perfectly, whereby the content of the ROM is erased perfectly.

It is confirmed that the EPROM device of this invention does not manifest any abnormal condition after lapse of 2,000 hours in an environmental temperature of 85 C. and a relative humidity of 85%, meaning that it has a sufficiently high reliability.

As described above, the EPROM device embodying the invention has the following advantages.

1. When compared with a conventional EPROM device contained in a ceramic package provided with a window the EPROM device of this invention can be manufactured with less cost.

2. Since low melting point glass is not used, it is not necessary to use a process step utilizing an elevated temperature of about 480° C., which increases the reliability of the device. Moreover, as it is possible to rely upon a wire bonding technique utilizing gold wires, high speed assembling is possible.

3. When compared with a prior art device in a ceramic package, the weight of the device can be reduced to about ¼.

The surface of light transmitting plate maybe curved or convex to provide a lens effect thereby improving the condensing performance of the incident light.

Furthermore, this invention is also applicable to an image sensor.

What is claimed is:

1. An erasable and programable read only memory device of the plastic package type comprising:
    an integrated circuit lead frame having an island area and a plurality of lead wires;
    an erasable and programable read only memory integrated circuit chip having an upper surface and a bottom surface, the bottom surface thereof mounted on said island area;
    a plurality of wires each adapted to connect a bonding pad of said erasable and programable read only memory integrated circuit chip to one of said lead wires of said integrated circuit lead frame;
    a thin silicone resin layer formed on the upper surface of said erasable and programable read only memory integrated circuit chip for transmitting ultraviolet rays to the upper surface of said erasable and programable read only memory integrated circuit chip;
    a window plate placed on the surface of said silicone resin layer to be bonded with said silicone resin layer, said window plate being of a high-purity alumina which can transmit ultraviolet rays; and
    a molded package of epoxy resin which prevents transmission of ultraviolet rays encapsulating said island area of said integrated circuit lead frame, said erasable and programable read only memory integrated circuit chip and said silicone resin layer without covering a surface of said window plate through which ultraviolet rays are transmitted to said erasable and programable read only memory integrated circuit chip.

2. The erasable and programable read only memory device of claim 1, wherein said window plate has a thickness of about 1.5 mm and said silicone resin layer has a thickness of about 10 to 20 microns.

* * * * *